(12) United States Patent
Suzuki et al.

(10) Patent No.: US 11,276,455 B1
(45) Date of Patent: Mar. 15, 2022

(54) SYSTEMS AND METHODS FOR MEMORY DEVICE POWER OFF

(71) Applicant: Micron Technology, Inc., Boise, ID (US)

(72) Inventors: Takamasa Suzuki, Hachioji (JP); Yasushi Matsubara, Isehara (JP); John D. Porter, Boise, ID (US); Ki-Jun Nam, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/082,964

(22) Filed: Oct. 28, 2020

(51) Int. Cl.
| | |
|---|---|
| *G06F 1/26* | (2006.01) |
| *G11C 11/4072* | (2006.01) |
| *G11C 11/4074* | (2006.01) |
| *G11C 7/06* | (2006.01) |
| *G11C 5/06* | (2006.01) |
| *G11C 11/4091* | (2006.01) |

(52) U.S. Cl.
CPC ............ *G11C 11/4072* (2013.01); *G11C 5/06* (2013.01); *G11C 7/065* (2013.01); *G11C 11/4074* (2013.01); *G11C 11/4091* (2013.01)

(58) Field of Classification Search
CPC .................................................. G11C 11/4072
See application file for complete search history.

(56) References Cited

U.S. PATENT DOCUMENTS

| | | | | |
|---|---|---|---|---|
| 2010/0146333 | A1* | 6/2010 | Yong | G06F 1/305 714/14 |
| 2010/0328849 | A1* | 12/2010 | Ewing | G06F 11/3062 361/622 |
| 2011/0110164 | A1* | 5/2011 | Jeong | G11C 29/028 365/189.02 |
| 2013/0322162 | A1* | 12/2013 | Lee | G11C 11/1675 365/158 |

\* cited by examiner

*Primary Examiner* — Min Huang
(74) *Attorney, Agent, or Firm* — Fletcher Yoder, P.C.

(57) ABSTRACT

A memory device is provided. The memory device includes a memory bank configured to store data in one or more memory cells. The memory device further includes a sense amplifier and associated circuitry configured to detect a first threshold representative of a first external voltage ramping down during a power off of the memory device, and one or more switches triggered via the sense amplifier and associated circuitry to provide for a power off sequence for the memory bank based on using a second external voltage ramping down during the power off of the memory device.

15 Claims, 8 Drawing Sheets

SYSTEMS AND METHODS FOR MEMORY DEVICE POWER OFF

BACKGROUND

Field of the Present Disclosure

The present disclosure relates to memory devices, and more specifically, to systems and methods for powering off memory devices.

Description of Related Art

Certain read/write memory devices, such as dynamic random access memory (DRAM), include arrays having memory cells that store information. For example, certain DRAM devices, such as synchronous dynamic RAM (SDRAM) devices may have multiple memory banks having many addressable memory elements or cells included in memory arrays. Similarly, persistent memory devices such as random access memory (RAM), non-volatile memory, and the like, may include memory elements or cells suitable for storing data. In use, the memory devices may receive data input signals at high speeds, such as speeds of 1 gigabits per second (Gbps) or more, and store data in the memory cells based on the data input signals. The memory cells may then be accessible to external systems and may be used to retrieve the data stored therein, for example, by providing for an address of one or more of the memory cells. It would be beneficial to improve powering off the memory devices.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
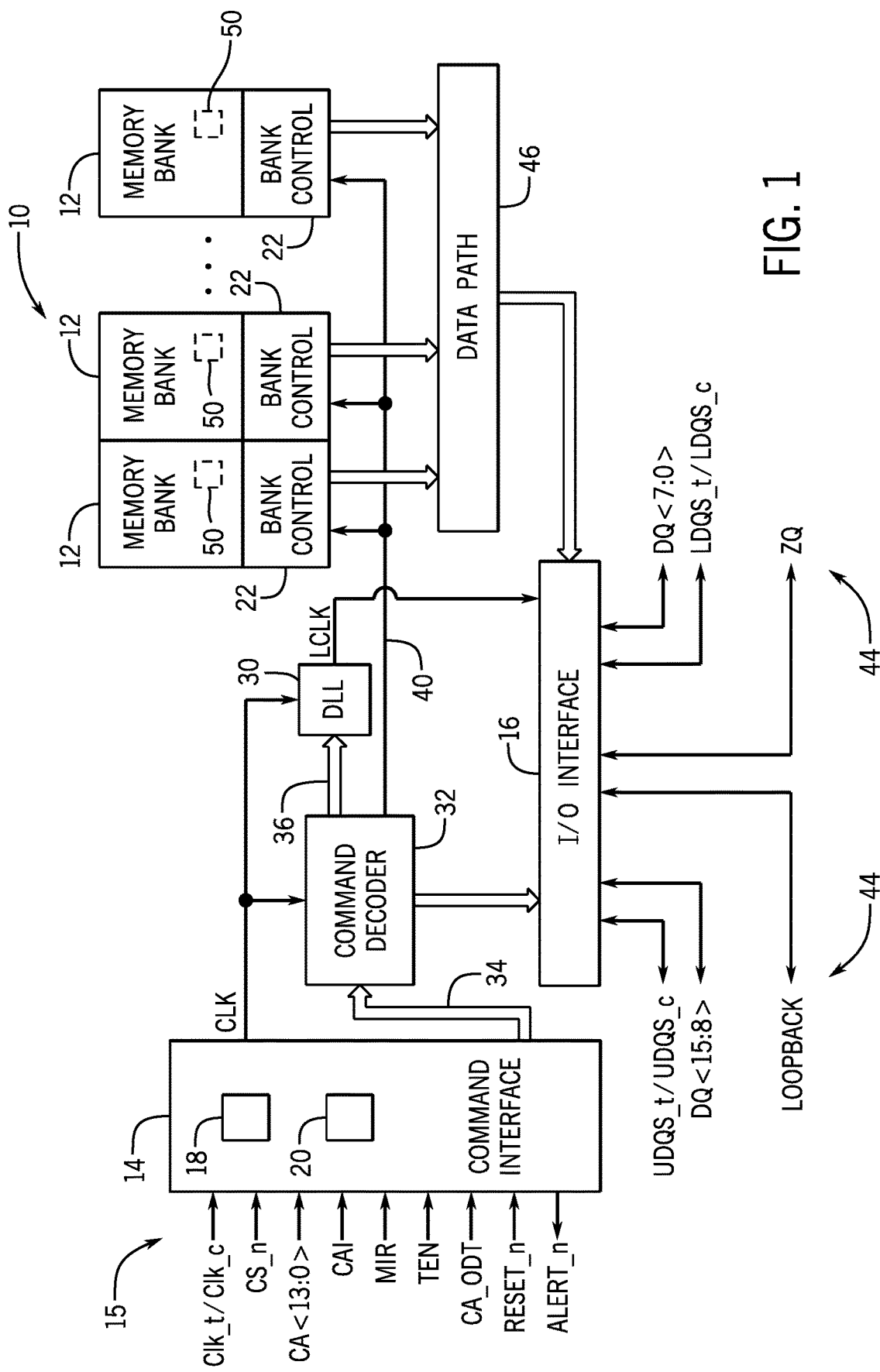
FIG. 1 is a block diagram illustrating an organization of a memory device that may include a memory array and cell power off system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include memory devices coupled to processing circuitry, and the memory devices may provide storage for data processing. Examples of memory devices include random access memory (RAM), dynamic RAM (DRAM) devices and synchronous DRAM (SDRAM) devices, and non-volatile memory devices, which may all store individual bits electronically. The stored bits may be organized into addressable memory elements (e.g., words), which may be stored in memory banks. To receive and to transmit the bits, the memory devices may include certain data communications circuitry as well as communication lines, useful in saving and retrieving the bits from the memory bank. In certain memory systems, including certain persistent memory systems, memory retention after power off may be improved via a ramp down approach to powering off the memory device, as further described below.

A ramp down technique for a memory device may include detecting that a first voltage source (e.g. VDD2 or VDD depending on the memory device specification used) is falling below a certain pre-set level or threshold, and in response, performing a certain sequence of events to insure and/or to improve data retention. The sequence of events (e.g., pre-charge all memory banks, ramp down certain internal voltages, and so on) may vary depending on the memory type, the memory architecture, and so on. The sequence of events may draw power during the shutting off condition from a second voltage source (e.g., VDD1 or VPP depending on the memory device specification used). For example, the second voltage source may be detailed in a memory specification (e.g., Joint Electron Device Engineering Counsel or "JEDEC") to remain powered at a time beyond the low level detection of the first voltage source, and may be also at a higher voltage than the first voltage source. The ramp down technique may then finish within a desired timing so that all voltages used (e.g., VDD1 and VDD2 or VPP and VDD) are kept within a timing specification for voltage levels (e.g., JEDEC specifications). Accordingly, no new power sources may be needed, and instead, external power sources already used, such as VDD1 and VDD2 or VPP and VDD power sources, may be reused. It is to be noted that while the examples described herein use the terms VDD2, VDD1 for first and second voltage sources, or VPP, VDD for first and second power sources, depending on the specification used (e.g., JEDEC specifications for memory such as LPPDDR and DDR5 respectively) the techniques described herein are applicable with first and second voltage sources used in various memory devices.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5

SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface 14 may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

The data (e.g., IO signals) for read and writes may be addressed to certain memory (e.g., memory cells) in the memory banks 12. The techniques described herein provide for an improved power off performance of the memory bank 12. Accordingly, a memory power off system 50 may include logic and/or circuitry that detects certain power off ramp downs based on a first voltage source (e.g., VDD2 or VDD depending on the specification, such as low power DDR5 [LPDDR5] (VDD2) or DDR5 (VDD)), and then further include certain logic and/or circuitry to perform a sequence of events based on the type of memory being used (e.g., SDRAM, persistent memory) to improve data retention of the memory banks 12. In some embodiments, the sequence of events may draw power from a second voltage source (e.g., VDD1 or VPP depending on the specification, such as LPDDR5 (VDD1) or DDR5 (VPP)), thus reusing voltage sources that may be already part of a memory device specification, as further described below.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD/VDD1/VPP and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description. For example, the memory power off system 50 or certain circuitry of the memory power off system 50 may be disposed as part of one memory bank 12, the bank controller 22, or combinations thereof. It is also noted that while the memory power off system 50 is depicted as part of the memory device 10, the memory power off system 50 may be included in other memory devices such as persistent memory (e.g., non-volatile dual in-line memory module (NVDIMM)), low power DRAM (LPDRAM), and so on.

Figure 2:
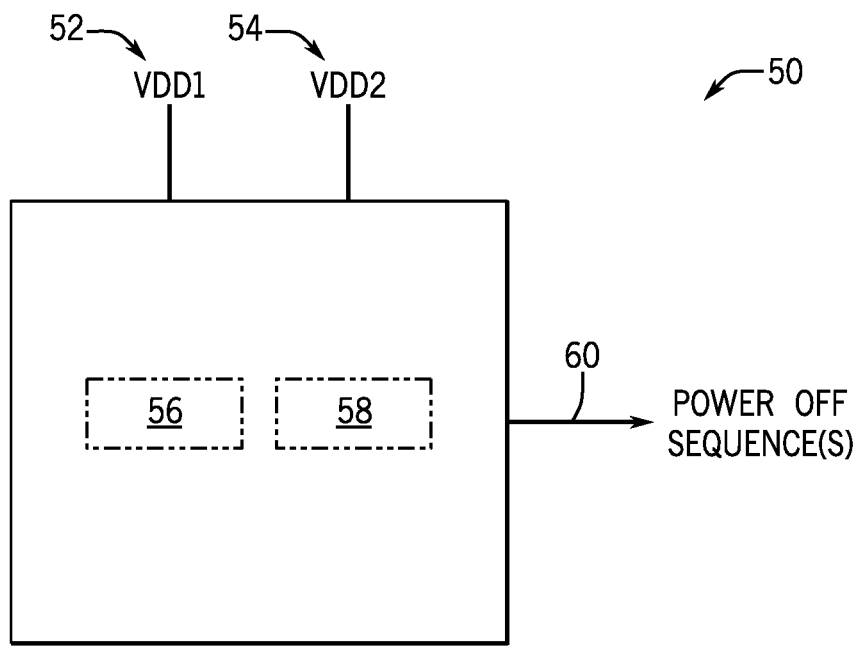
FIG. 2 is a block diagram of the power off system of FIG. 1, in accordance with an embodiment.

It would be beneficial to illustrate an embodiment of a memory power off system 50. Accordingly, FIG. 2 depicts an embodiment of a simplified memory power off system 50 which may be included and/or operatively coupled to one or more memory banks 12. It is to be understood that the depicted embodiment is a simplified example only, useful for illustration, and that other memory power off systems 50 may include more or less components and/or connections. In the depicted embodiment, a VDD1 power supply 52 and a VDD2 power supply 54 may be included in the memory device 10 as drain power voltages. VDD1 and VDD2 may be used as primary external power voltages (e.g., drain power voltages) on metal oxide semiconductor (MOS) devices that use a potential that differs from the normal system logic voltage.

VDD1 52 and VDD2 54 may be provided, for example, via synchronous buck converter circuitry to be used by the memory device 10. VDD1 may be replaced with VPP and VDD2 with VDD based on the memory device specification used. Depending on the type of memory used, VDD1 and VDD2 may have voltages specified (e.g., JEDEC specified) to be at certain values or ranges. For example, for low power DDR5 (LPDDR5), VPP or VDD1 may be at between 1.7 and 1.95 volts DC with a typical voltage of 1.8 volts DC, while VDD or VDD2 may be at between 1.01 and 1.12 volts DC with a typical voltage of 1.05 DC with VPP or VDD1 greater than VDD or VDD2 to prevent latch up. The specification (e.g., JEDEC specification) may additionally include certain power off procedures. For example, for LPDDR5, the JEDEC specification (e.g., JESD209-5A) states that "while powering off, CS must be held LOW (≤VILPD) and all other inputs must be between VILmin and VIHmax . . . the SDRAM outputs remain at High-Z while CS is held LOW. DQ, DMI, WCK_t and WCK_c, RDQS_t, CK_t, CK_c, and CA voltage levels must be between VSS and VDDQ during voltage ramp to avoid latch-up. RESET_n input levels must be between VSS and VDD2H during voltage ramp to avoid latch up."

The LPDDR5 JEDEC specification further states that "Tx is the point where any power supply drops below the minimum value specified . . . Tz is the point where all power supplies are below 300 mV . . . after Tz, the SDRAM is powered off." The LPDDR5 JEDEC specification also accounts for an uncontrolled power off sequence, stating that "when an uncontrolled power-off occurs, the following condition must bet met . . . at Tx, when the power supply drops below the minimum values specified, all power supplies must be turned off and all power supply current capacity must be at zero, except any static charge remaining in the system." The LPDDR5 JEDEC specification additionally states that "after Tz (the point at which all power supplies first reach 300 mv), the SDRAM must power off . . . . Between Tx and Tz the relative voltage between power supplies is uncontrolled . . . VDD1, VDD2H and VDD2L must decrease with a slope lower than 0.5V/μs between Tx and Tz" and the JEDEC specification also defines tUNCTL_POFF (e.g., maximum power-off ramp down time) as having a maximum value of 2 seconds.

Other specifications may list similar conditions. Accordingly, the memory power off system 50 may use power supply 54 as a power off detection signal and power supply 52 as a power source to use during power off. For example, logic/circuitry 56 may include sensing circuitry (e.g., voltage sensing circuitry such as a sense amplifier and associated circuitry) that triggers power off actuation circuitry 58 when power supply 54 enters a ramp down mode and/or falls below a certain voltage. The sensing circuitry 56 may include voltage sensors and/or voltage detection circuitry (e.g., resistor-capacitor-transistor circuitry for low voltage detection, such as one or more switches or dampers triggered via the sense amplifier and associated circuitry). The power off actuation circuitry 58 may then use power supply 52 to provide for one or more power sequences 60, for example, to improve data retention and increase memory component life, as further described below. The power sequence(s) 60 may be used to power, for example, voltage controls, dampers, level shifters, state machine and/or protection logic disposed near the memory bank 12, high accuracy voltage detectors, and so on, during power off. By keeping the power off actuation circuitry 58 in the power supply 52 domain, it may be easier and more efficient to ensure data persistency since power supply 52 power is specified to stay on as power supply 54 goes to 0 volts.

Figure 3:
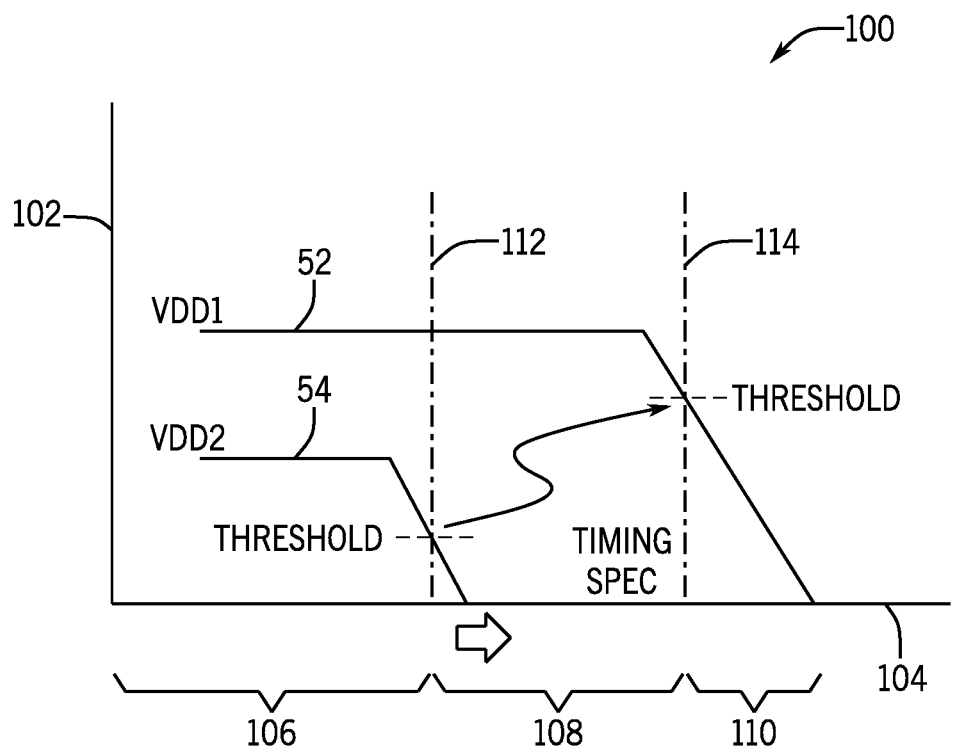
FIG. 3 depicts a timing diagram of voltages during powering off of the memory device of FIG. 1, in accordance with an embodiment.

Turning now to FIG. 3, the figure illustrates a timing diagram 100 showing embodiments of VDD1 52 (or VPP) and VDD2 54 (or VDD) voltages in a first axis 102 displayed over a time axis 104. The timing diagram 100 is shown as split into three time regions 106, 108, and 110. During power off, VDD2 54 is illustrated as ramping down (e.g., in region 106) until VDD2 54 voltage gets to a threshold value 112. The threshold value 112 is representative of a voltage at which the memory power off system 50 detects a power off occurring and takes action, for example, by providing power off sequences 60 in the VDD1 52 domain.

More specifically, the sensing logic or circuit 56 may be continuously monitoring VDD2 54 during operations of the memory device 10, and when the threshold 112 is reached, for example, after VDD2 54 is at a previous higher plateau voltage, the sensing logic or circuit 56 may then enable the power off actuation circuitry 58 to provide for an improved power off sequence 60 during region 108. The power off actuation circuitry 58 may execute during region 108 until a second threshold 114 is detected. The second threshold 114 may be representative of a timing spec and/or a voltage at which VDD1 52 is no longer suitable for powering the sequence(s) 60. Accordingly, the power off actuation circuitry 58 may be deactivated and region 110 may not have any power off sequences 60 being executed. By using external voltages such as VDD2 54 to first detect power off, and then VDD1 52 to provide for the power used by the power off sequence(s) 60, the techniques described herein may use existing power supply components to improve memory retention and power off efficiency.

Figure 4:
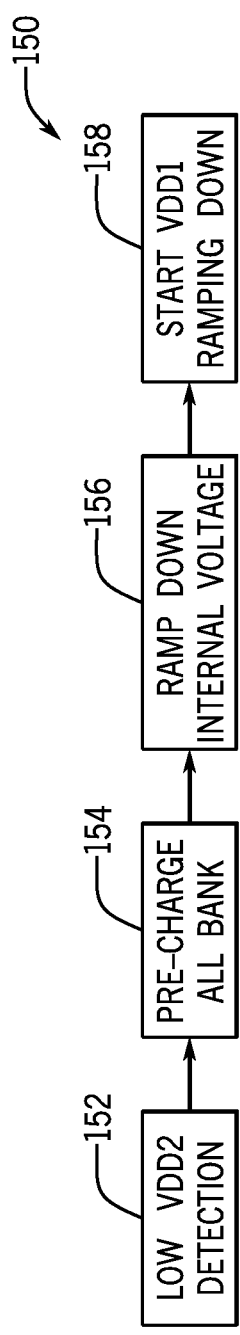
FIG. 4 is a flowchart of a power off sequence to be used to power off the memory device of FIG. 1, in accordance with an embodiment.

Turning now to FIG. 4, the figure displays a flowchart illustrating an embodiment of a power off sequence 150 that may be included as one of the power off sequences 60 and provided by the memory power off system 50. In the depicted embodiment, the power off sequence 150 may first detect (block 152) a low VDD2 54, for example, following the VDD2 54 being at a plateau voltage and then entering the threshold 112. Indeed, in some embodiments, the low VDD2 54 may be equivalent to the voltage threshold 112 of FIG. 3. The power off sequence 150 may then pre-charge (block 154) all memory banks 12. For example, a given memory device type (e.g., SDRAM, persistent memory) may include bank pre-charge circuitry. The pre-charging of the memory block (block 154) may then provide VDD1 52 power to the bank pre-charge circuitry to improve data retention before shutdown.

The power off sequence 150 may then ramp down (block 156) internal voltages of the memory banks 12. That is, the memory banks may include a plurality of internal voltages used to operate the memory banks 12, such as internally generated voltages to maintain data values in memory array cells, internal voltages to operate the memory bank, internal voltages to communicate within the memory bank, internal voltages to communicate outside of the memory bank, and so on. That is, instead of allowing internal voltages to "float", the power off sequence 150 may now ramp down the internal voltages, for example, via voltage controls, dampers, level shifters, state machine and/or protection logic disposed near the memory bank 12. Accordingly, the circuits involved in blocks 152-158 may now be placed in the VDD1 52 domain.

The power off sequence 150 may then start (block 158) VDD1 52 ramping down. For example, the memory device 10 specification may detail how to ramp down VDD1 52 during shutdown operations, and such VDD1 52 ramp down procedure may thus be executed (block 158). By providing for the power off sequence 150, the techniques described herein may enable a more efficient and improved memory power off.

Figure 5:
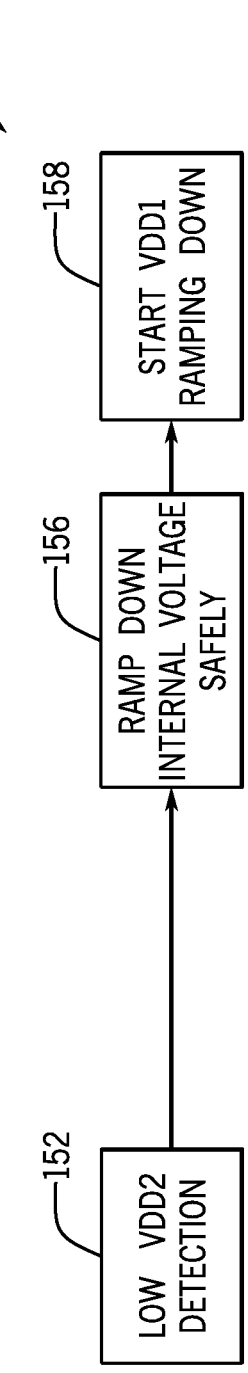
FIG. 5 is a flowchart of another power off sequence to be used to power off the memory device of FIG. 1, in accordance with an embodiment.

FIG. 5 displays a flowchart illustrating an embodiment of a power off sequence 200 that may be included as one of the power off sequences 60 provided by the memory power off system 50. Because the figure includes some of the same elements as shown in FIG. 4, the elements are numbered using the same element numbers. In the depicted embodiment, the power off sequence 200 may first detect (block 152) a low VDD2 54, for example, following the VDD2 54 being at a plateau voltage and then entering a threshold. In some embodiments, the low VDD2 54 may be equivalent to the voltage threshold 112 of FIG. 3. In the depicted embodiment, a pre-charge (block 154 of FIG. 4) may now not be used. For example, an idle state for the memory device 10 may be initiated and thus pre-charging may not be used.

The power off sequence 150 may then ramp down (block 156) internal voltages of the memory banks 12. That is, the memory banks 12 may include a plurality of internal voltages used to operate the memory banks 12, such as internally generated voltages to maintain data values in memory array cells, internal voltages to operate the memory bank, internal voltages to communicate within the memory bank, internal voltages to communicate outside of the memory bank, and so on. That is, instead of allowing internal voltages to "float", the power off sequence 150 may now ramp down the internal voltages, for example, via voltage controls, dampers, level shifters, state machine and/or protection logic disposed near the memory bank 12. Accordingly, the circuits involved in blocks 152, 156 may now be placed in the VDD1 52 domain. The power off sequence 150 may then start (block 158) VDD1 52 ramping down. For example, the memory device 10 specification may detail how to ramp down VDD1 52 during shutdown operations, and such VDD1 52 ramp down procedure may thus be executed (block 158).

Figure 6:
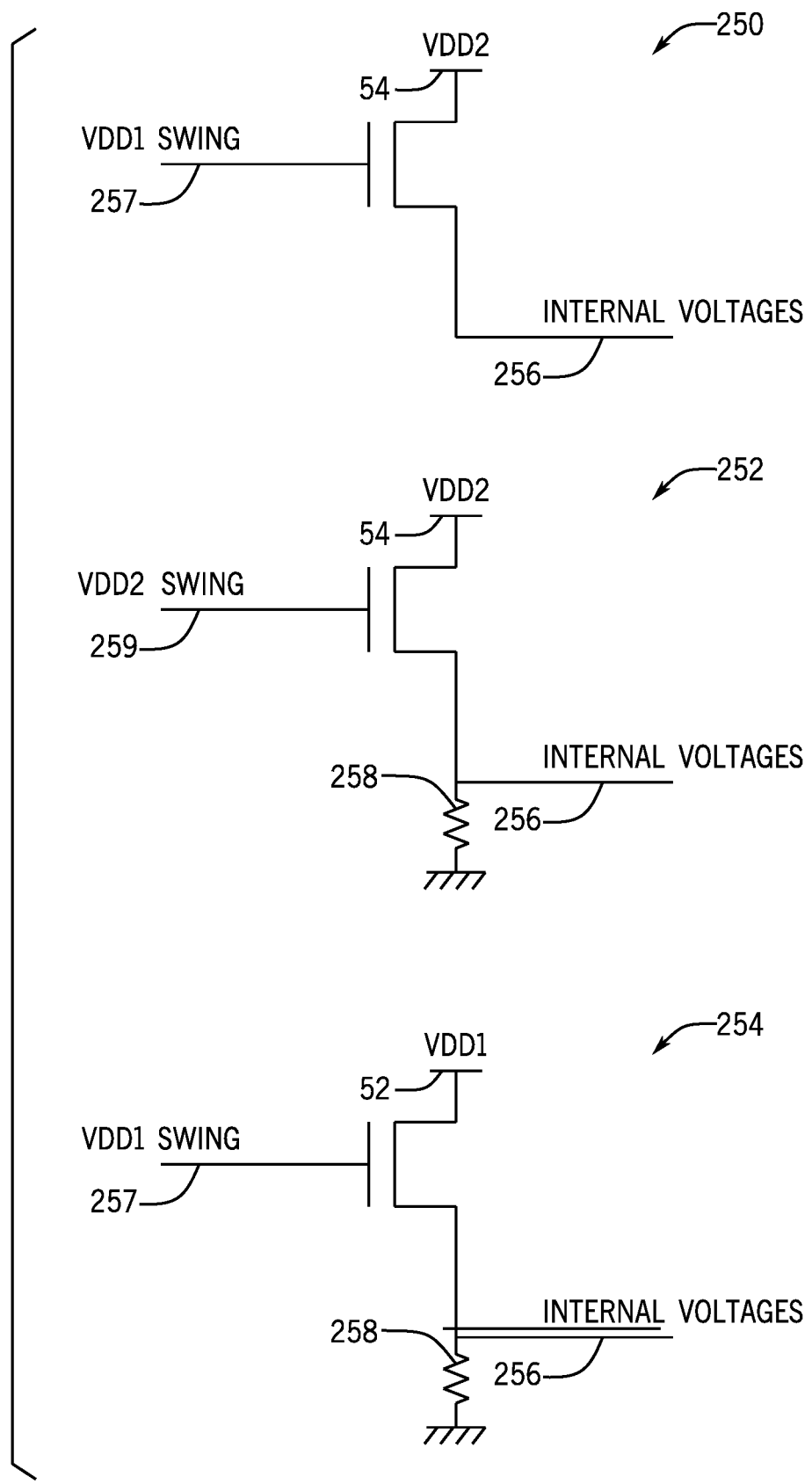
FIG. 6 illustrates schematic diagrams for three damper circuits, in accordance with an embodiment.

It may be useful to describe several circuits (e.g., power off actuation circuits 58), such as dampers, that may be used with the techniques described herein. Turning now to FIG. 6, the figure illustrates schematic diagrams of embodiments of three dampers or clamping circuits 250, 252, 254. It is to be understood that the depicted embodiment is a simplified example only, useful for illustration, and that other dampers 250, 252, 254 may include more or less components and/or connections. In use, the dampers 250, 252, 254 may be used to limit or otherwise clamp output voltages, for example internal voltages 256. In the depicted embodiment, the damper 250 may be used to maintain a clamped voltage level of min (VDD1–Vth, VDD2) at power up and VDD2 54 at power off for the internal voltages 256. A VDD1 swing signal 257 may be used, for example, provided by the sensing circuit 56, to denote that the threshold 112 has been detected and thus activating the damper 250.

The damper 252 may include a VDD2 swing signal 259, which may be representative of VDD2 54 reaching threshold 114. The damper 252 additional includes a bleeder resistor or system 258 coupled to VSS. The damper 252 may provide both power up and power off clamped voltage of VDD2–Vth, with the bleeder resistor 258 pulling down to VSS weakly. The damper 254 may include the VDD1 swing signal 257 latched to its gate. Accordingly, when VDD1 54 reaches threshold 112 the damper 254 may be activated. The damper 254 may thus provide a clamped voltage level of VDD1–Vth at power up and also at power off. It is to be understood that the dampers 250, 252, 254 are shown as a single transistor for illustration purposes, and that implementations of the dampers 250, 252, 254 may include multiple transistors, resistors, capacitors, and other circuit components.

Figure 7:
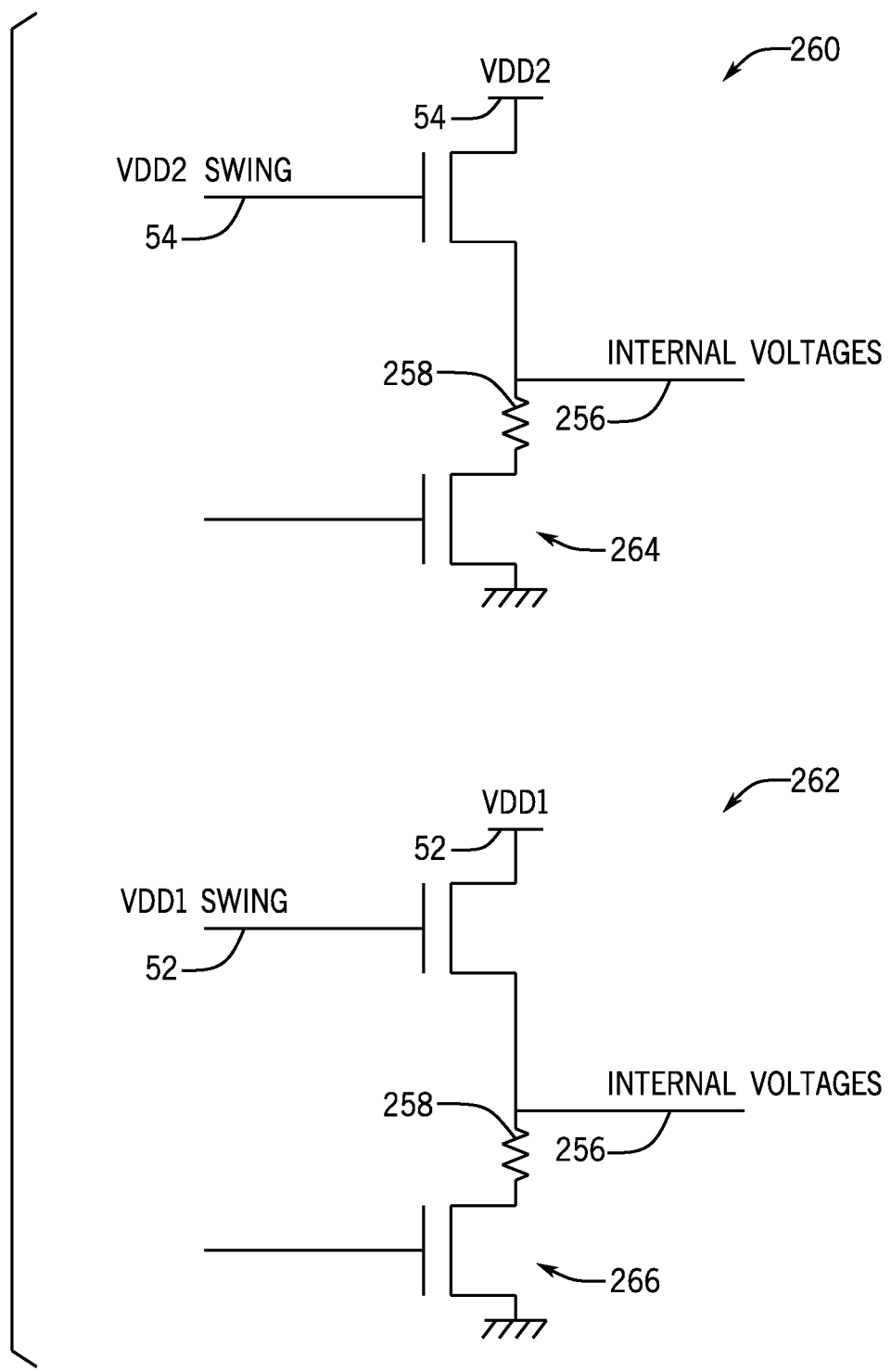
FIG. 7 illustrates schematic diagrams for two additional damper circuits, in accordance with an embodiment.

FIG. 7 illustrates schematic diagrams of embodiments of two dampers or clamping circuits 260, 262. It is to be understood that the depicted embodiment is a simplified example only, useful for illustration, and that other dampers 260, 262 may include more or less components and/or connections. Because the figure includes some of the same elements as shown in FIG. 6, the elements are numbered using the same element numbers. In the depicted embodiment, dampers 260, 262 are equivalent to dampers 252, 254 of FIG. 6 but include an additional transistor switch 264, 266 respectively.

In use, the clampers 260, 262 may be used to limit or otherwise clamp output voltages, for example internal voltages 256. The clamper 260 may provide both power up and power off clamped voltage of VDD2–Vth, with the bleeder resistor 258 pulling down to VSS weakly, but with the switch 264 helpful in saving standby current. Clamper 262 may provide a clamped voltage level of VDD1–Vth at power up and also at power off, with the switch 266 also helpful in saving standby current.

Figure 8:
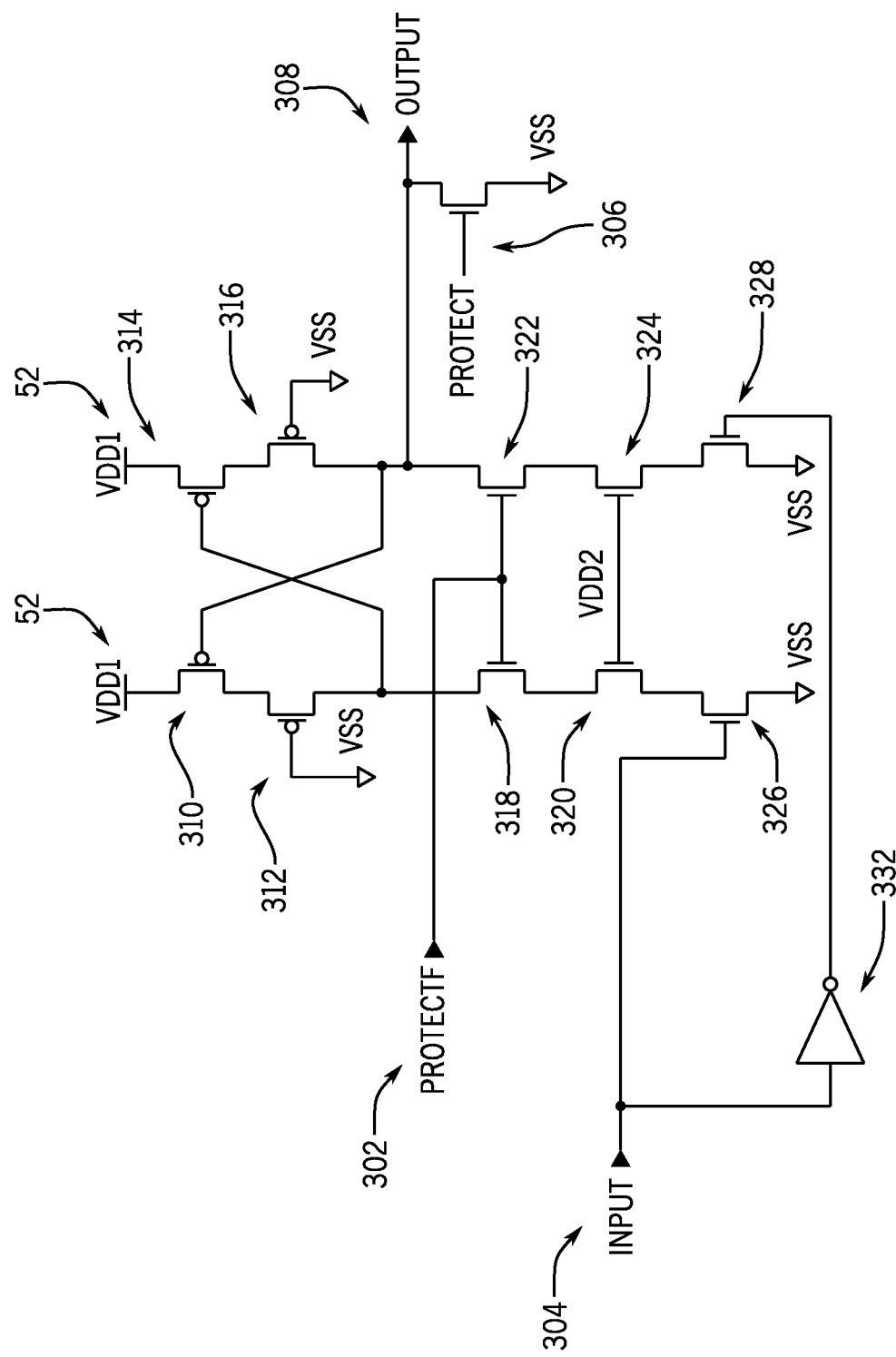
FIG. 8 depicts a schematic diagram for a level shifter circuit, in accordance with an embodiment.

It may be useful to describe other memory components or circuitry that may use the techniques described herein. Turning now to FIG. 8, the figure is a schematic diagram illustrating an embodiment of a level shifter circuit 300 (e.g., another example of a power off actuation circuit 58) that may now be placed in the VDD1 52 domain. The level shifter circuit 300 may be used, for example, with non-volatile memory, such as non-volatile dual in-line memory modules (NVDIMMs) and the like. It is to be understood that the depicted embodiment is a simplified example only, useful for illustration, and that other level shifter circuits 300 may include more or less components and/or connections.

In the depicted embodiment, the level shifter circuit 300 may be a up shifter or protection logic that receives input voltages and/or signals through inputs 302, 304, and 306, and then provides output voltages in the VDD1 52 domain through output 308. For example, once power off is detected and signals transmitted (e.g., via input 304), the VCCP may be shortened to VDD1 52 and level shifters, such as the level shifter circuit 300, may now be controlled via VDD1 52. As shown the level shifter 300 includes four P type transistors 310, 312, 314, and 316 that may be connected in a cross-junction configuration. Transistors 310 and 314 have their sources directly coupled to VDD1 52.

The level shifter circuit 300 also includes N type transistors (e.g., "thick" transistors) 318, 320, 322, 324 disposed downstream from the cross junction transistors 310, 312, 314, and 316. Gates of transistors 318 and 322 are connected to the input 302 while gates of transistors 320 and 324 are connected to input 305. The level shifter circuit 300 further includes N-type transistors 326 and 328 disposed downstream from the transistors 318, 320, 322, 324. Gates of the transistors 326 and 328 are connected to the input 304. Another N-type transistor 330 is shown, having a gate also connected to input 306, and a diode 332 that may connect input 304 to the gate of transistor 328.

In use, transistors 318, 320, 322, 324 may be pull up transistors, enabling the output 308 to provide VDD1 52 voltage. The transistors 326, 328 may work as pull down transistors lowering the output voltage of output 308, for example, via VSS. The level shifter circuit 300 may be placed in an array-periphery boundary, for example, inside a generator/clamper control for the memory bank 12. By providing for VDD1 52 voltage, for example, based on VDD2 54 voltage detection, the level circuit 300 may now enhance memory retention and protection for cells in the memory bank 12.

Figure 9:
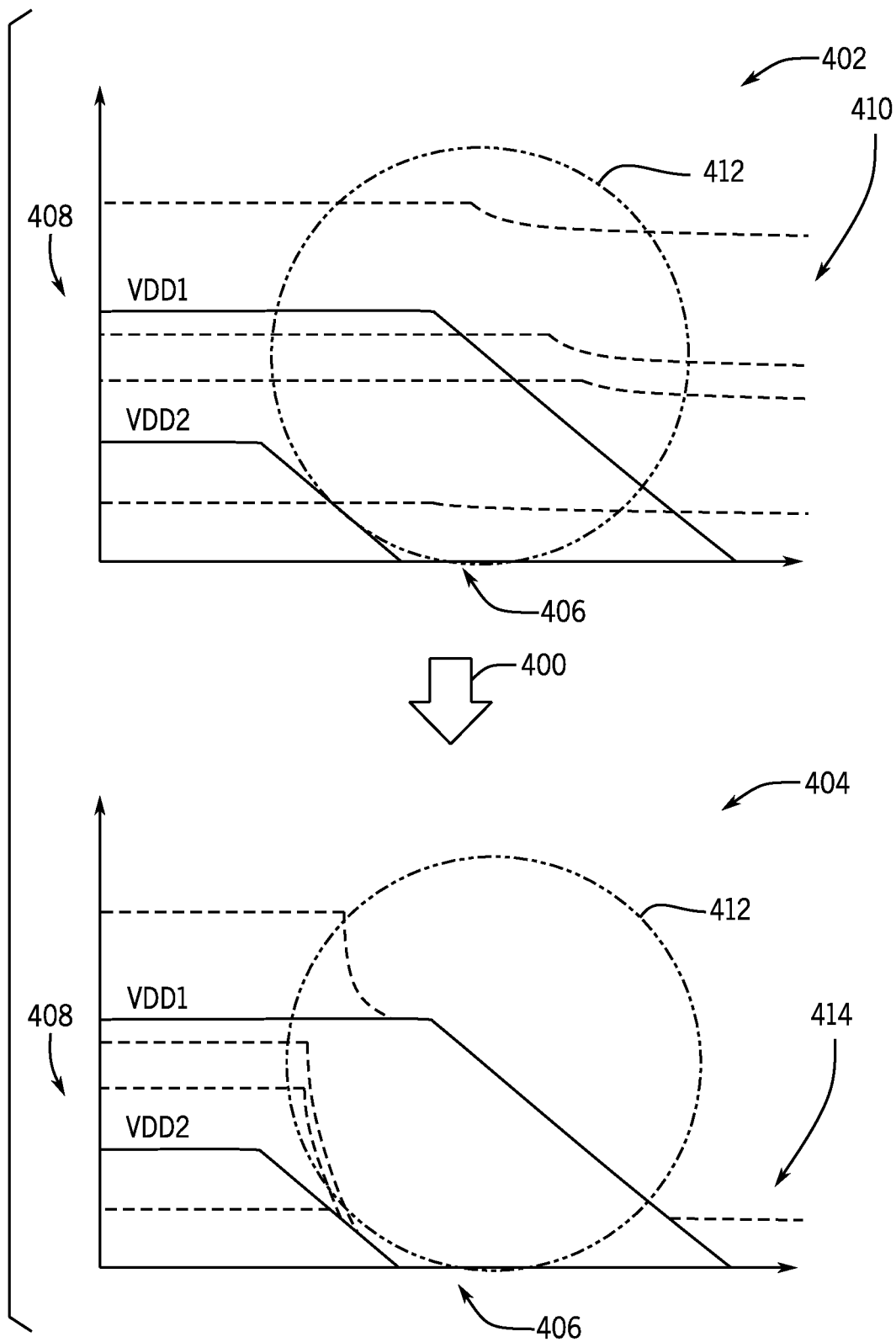
FIG. 9 depicts side-by-side timing diagrams comparing internal voltages of a memory bank, in accordance with an embodiment.

FIG. 9 illustrates an embodiment of signal transformations 400 that may result from using the techniques described herein. In the depicted embodiment, two graphs 402 and 404 are shown. The graphs 402 and 404 both include a time axis 406 and a voltage axis 408. Graph 402 shows plurality of internal voltages 410 that may be present in a memory bank, such as the memory bank 12. Section 412 shows differences between the various internal voltages 410 during operations of the memory device 10.

Graph 404 shows the results after transformation 404 is applied. More specifically, transformation 400 may now include using VDD1 52 as the domain for the internal voltages 410, transforming the internal voltages 410 into internal voltages 414. As shown, section 412 now includes "cleaner" and more uniform internal voltages 414 when compared to the internal voltages 410. Indeed, by using VDD1 52, for example, triggered via VDD2 54, the techniques described herein may provide for improved power off performance of the memory device 10.

Figure 10:
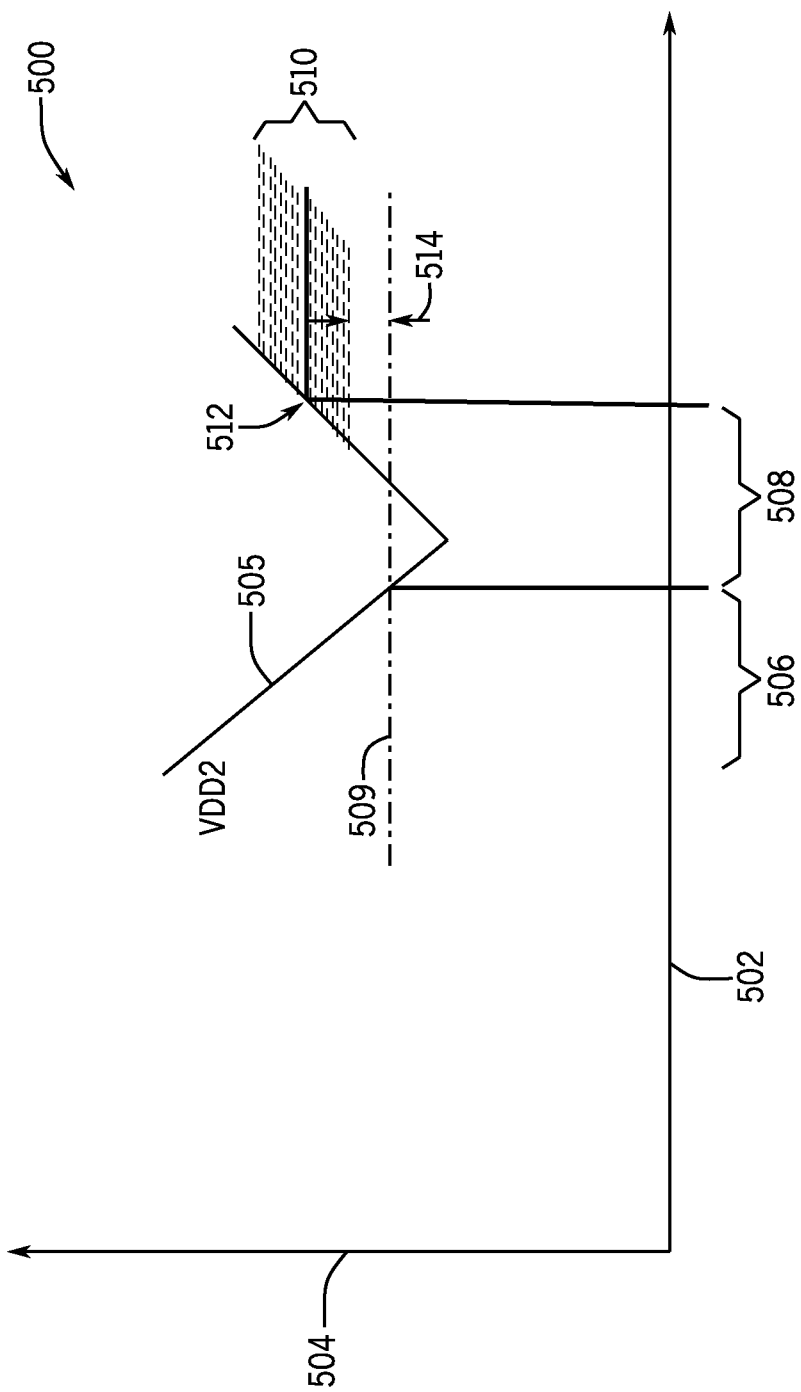
FIG. 10 depicts a timing diagram of voltages during powering off of a non-volatile memory device, in accordance with an embodiment.

The techniques described herein may also be used, for example, in situations where more accurate voltage detection, such as external voltage detection, is desired. For example, FIG. 10 illustrates a graph 500 showing certain performance details of ferroelectric RAM (FeRAM) non-volatile memory. The graph 500 includes a time axis 502 and a voltage axis 504. In the illustrated example, VDD2 voltage 505 is shown as ramping down at region 506. Beginning with region 508, the VDD2 voltage 505 ramp down now crosses a voltage threshold 509 and is detected as representative of a memory power off. However, because of low voltage conditions and/or trimming variations 510 in the manufacture of the FeRAM, trimming information in region 508 may be lost. An internal reference voltage based detector may not be as accurate with lost trimming information.

However, by using the techniques described herein, a local latch may be now be used to store trimming information using the VDD1 domain, which may have a higher voltage and/or not ramp down as quickly as VDD2 505. Accordingly, a sequence 60 may include using the local latch in the VDD1 during the region 508 to store, for example, trimming information. Once a threshold 512 is reached, VDD1 may no longer be used as voltage levels may now return accurate measurements again. A distance 514 between threshold 509 and the trimming variations 510 is also shown, which may be used as a design margin to account for the trimming variations 510, e.g., to account for different trims or manufactured differences in memory components. By using VDD2 505 to enable a VDD1 based latch, the techniques described herein may provide for enhanced external voltage detection and improved non-volatile memory systems as well.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
   a memory bank configured to store data in one or more memory cells;
   a sense amplifier and associated circuitry configured to detect a first threshold representative of a first external voltage ramping down during a power off of the memory device; and
   one or more switches triggered via the sense amplifier and associated circuitry, the one or more switches configured to provide a power off sequence for the memory bank based on using a second external voltage ramping down during the power off of the memory device, wherein the one or more switches comprises a clamper, a level shifter, a voltage control, a state machine, a protection logic, or a combination thereof, and wherein the clamper comprises a single transistor configured to limit or otherwise clamp a voltage connected to a source of the single transistor, and wherein a drain of the single transistor is electrically coupled to deliver one or more internal voltages used by the memory bank.

2. The memory device of claim 1, wherein the first external voltage comprises a VDD2 or VDD voltage used as a primary voltage on a metal oxide semiconductor (MOS) device.

3. The memory device of claim 2, wherein the second external voltage comprises a VDD1 or VPP voltage having a higher voltage than VDD2 or VDD and used as another primary voltage on a MOS device.

4. The memory device of claim 3, wherein VDD2 or VDD is specified via a specification to ramp down at a time before VDD1 or VPP during power off of the memory device.

5. The memory device of claim 1, wherein the power off sequence comprises ramping down internal voltages of the memory bank by using the second external voltage.

6. The memory device of claim 5, wherein the power off sequence comprises pre-charging the memory bank using the second external voltage before ramping down the internal voltages.

7. The memory device of claim 1, wherein the level shifter comprises an up level shifter configured to provide the second external voltage as output.

8. A method for powering off a memory device, comprising:
   sensing, via a sensing circuit included in the memory device, a first threshold representative of a first external voltage ramping down during a power off of the memory device;
   providing, via a power off actuation circuit triggered via the sensing circuit, a power off sequence for the memory bank based on using a second external voltage ramping down during the powering off of the memory device;
   storing local latch trimming information via a local latch being powered by the second external voltage after sensing that the first threshold has been crossed; and
   using the local latch trimming information to derive a measure of the first external voltage.

9. The method of claim 8, comprising executing the power off sequence to ramp down internal voltages of the memory bank by using the second voltage.

10. The method of claim 9, comprising executing the power off sequence to pre-charge the memory bank before ramping down the internal voltages.

11. The method of claim 8, wherein the first external voltage is specified via a specification to ramp down at a time before the second external voltage.

12. A memory device, comprising:
    a memory power off system comprising circuitry configured to:
    sense a first threshold representative of a first external voltage ramping down during a power off of the memory device; and
    provide a power off sequence for a memory bank based on using a second external voltage ramping down during the power off of the memory device, wherein the circuitry comprises a level shifter circuit configured to provide the second external voltage as output via two or more transistors electrically coupled to each other via a cross-junction.

13. The memory device of claim 12, wherein the circuitry comprises a clamper, a level shifter, a voltage control, a state machine, a protection logic, or a combination thereof.

14. The memory device of claim 13, wherein the clamper comprises a transistor configured to limit or otherwise clamp a voltage connected to a source of the transistor, and wherein a drain of the single transistor is electrically coupled to deliver one or more internal voltages used by the memory bank.

15. The memory device of claim 12, wherein the circuitry comprises a local latch configured to store trimming information after sensing that the first threshold has been crossed.

* * * * *